(12) United States Patent
Wang

(10) Patent No.: US 12,293,468 B2
(45) Date of Patent: May 6, 2025

(54) SYSTEM AND METHOD OF GENERATING SMOOTH SPLINE SURFACE MODEL PRESERVING FEATURE OF PHYSICAL OBJECT

(71) Applicant: ANSYS, INC., Canonsburg, PA (US)

(72) Inventor: Wenyan Wang, Wilmette, IL (US)

(73) Assignee: ANSYS, INC., Canonsburg, PA (US)

( * ) Notice: Subject to any disclaimer, the term of this patent is extended or adjusted under 35 U.S.C. 154(b) by 145 days.

(21) Appl. No.: 17/832,447

(22) Filed: Jun. 3, 2022

(65) Prior Publication Data
US 2023/0394768 A1 Dec. 7, 2023

(51) Int. Cl.
*G06T 17/30* (2006.01)
*G06F 30/20* (2020.01)

(52) U.S. Cl.
CPC .............. *G06T 17/30* (2013.01); *G06F 30/20* (2020.01)

(58) Field of Classification Search
CPC ................................ G06T 17/30; G06F 30/20
USPC ......................................................... 345/423
See application file for complete search history.

(56) References Cited

U.S. PATENT DOCUMENTS

| | | | | |
|---|---|---|---|---|
| 2004/0189633 | A1* | 9/2004 | Sederberg | G06T 17/20 345/418 |
| 2013/0016112 | A1* | 1/2013 | Burley | G06T 15/04 345/582 |
| 2018/0365371 | A1* | 12/2018 | Urick | G06F 30/15 |
| 2019/0385366 | A1* | 12/2019 | Sederberg | G06T 17/30 |
| 2020/0150624 | A1* | 5/2020 | Marinov | G06F 30/10 |
| 2022/0309749 | A1* | 9/2022 | Marshall | G06F 30/12 |
| 2023/0120926 | A1* | 4/2023 | Thomas | G06F 30/23 703/1 |

OTHER PUBLICATIONS

Wang,W., Zhang, Y., Du, X., & Zhao, G. (2019). An efficient data structure for calculation of unstructured T-spline surfaces. Visual Computing for Industry, Biomedicine, and Art, 2, 1-9.*
Scott, M. A., Simpson, R.N., Evans, J.A., Lipton, S., Bordas, S. P.,Hughes, T. J., & Sederberg, T. W. (2013). Isogeometric boundary element analysis using unstructured T-splines. Computer Methods in Applied Mechanics and Engineering, 254, 197-221.*

(Continued)

*Primary Examiner* — Jin Ge
(74) *Attorney, Agent, or Firm* — WOMBLE BOND DICKINSON (US) LLP

(57) ABSTRACT

A method and a system of generating a smooth spline surface from a quadrilateral mesh representing a physical object, is described. Edge points are added to the quadrilateral mesh to preserve a feature or a boundary. The edge points are added to an edge of the quadrilateral mesh having one or more irregular nodes representing a feature edge of the physical object and/or the edge points are added to an edge of the quadrilateral mesh extending between the feature edge and an irregular node. Knot interval vectors are extracted for each edge point and used to evaluate an irregular element having the edge points to generate the smooth spline surface. The smooth spline surface is highly continuous and can be displayed to model the physical object, modify a design of the physical object, or used directly in a simulation to evaluate the physical object. Other embodiments are also described and claimed.

17 Claims, 14 Drawing Sheets

(56) References Cited

OTHER PUBLICATIONS

L. Liu, Y. Zhang, X. Wei, Handling extraordinary nodes with weighted T-spline basis functions, Procedia Eng. 124 (2015) 161-173. 24th International Meshing Roundtable.*
W. Wang, Y. Zhang, G. Xu, T.J.R. Hughes, Converting an unstructured quadrilateral/hexahedral mesh to a rational T-spline, Comput. Mech. 50 (2012) 65-84.*
W. Wang, Y. Zhang, M.A. Scott, T.J.R. Hughes, Converting an unstructured quadrilateral mesh to a standard T-spline surface, Comput. Mech. 48 (2011) 477-498.*
D. Toshniwal, H. Speleers, T.J.R. Hughes, Smooth cubic spline spaces on unstructured quadrilateral meshes with particular emphasis on extraordinary points: Geometric design and isogeometric analysis considerations, Comput. Methods Appl. Mech. Engrg. 327 (2017).*
Wei, Xiaodong et al. "Analysis-suitable unstructured T-splines: Multiple extraordinary points per face", Comput. Methods Appl. Mech. Engrg. 391 (Jan. 6, 2022) 114494, 34 pages.

* cited by examiner

SYSTEM AND METHOD OF GENERATING SMOOTH SPLINE SURFACE MODEL PRESERVING FEATURE OF PHYSICAL OBJECT

BACKGROUND

Field

The present disclosure relates to methods and systems of modeling physical objects. More specifically, the present disclosure relates to methods and systems of generating a smooth spline surface to model a physical object.

Background Information

Spline surfaces are used in computer-aided design and computer graphics to represent freeform surfaces of physical objects. Spline surfaces can be constructed from unstructured quadrilateral meshes. More particularly, a quadrilateral mesh including data points representing a surface of the physical object can be evaluated by mathematical techniques to generate a smooth spline surface that may be used to model the physical object in a computer-aided design software application or used to simulate performance of the physical object, e.g., to perform stress analysis of the physical object. The mathematical techniques used to evaluate the quadrilateral mesh determine an accuracy of the model and/or analysis of the physical object. For example, differing techniques can produce differing levels of continuity in the spline surface. The higher the continuity, the more accurately the spline surface will represent the physical object.

SUMMARY

Existing methods of constructing smooth spline surfaces from unstructured quadrilateral meshes are restricted in their accuracy and/or efficiency. When constructing smooth spline surfaces from unstructured quadrilateral meshes, some methods can give C1 continuity smoothness around irregular nodes and satisfy partition of unity, but do not allow irregular nodes to be on a boundary or feature of the physical object being modeled. Other methods allow irregular nodes to be on a boundary or feature of the physical object being modeled, but only achieve C0 continuity around a 2-ring neighborhood of the irregular nodes, and do not satisfy partition of unity. Rational basis functions must then be used to overcome the partition of unity problem, which slows down the analysis process. Accordingly, there is a need for a method of generating a smooth spline surface that can both accurately and efficiently model a physical object.

A method and system of constructing a smooth spline surface, accurately and efficiently, from an unstructured quadrilateral mesh having irregular node(s) on a feature or a boundary of a physical object, is provided. In an embodiment, the system has memory and one or more processors configured to execute instructions stored on a non-transitory computer-readable medium to cause the system to perform the method. The method includes receiving the quadrilateral mesh representing a surface of the physical object. The physical object includes some features, e.g., a sharp edge (a feature edge) or a sharp corner (a feature corner), that is represented by an edge/node in the quadrilateral mesh. In an embodiment, the quadrilateral edge representing the feature edge may include an irregular node. Existing techniques of generating a spline surface from the quadrilateral mesh could generate the spline surface as a model preserving the feature(s) of the physical object, however, the model would only have C0 continuity along the quadrilateral edge having the irregular node. With such low continuity, the region around the irregular node is jagged or unsmooth. The current method can avoid such pitfalls and produce a smooth spline surface in the region by adding one or more edge points to the quadrilateral mesh around the irregular node. More particularly, the edge point(s) can be added on the edge representing the feature edge, or adjacent thereto. A knot interval vector, including one or more knot intervals, is determined for the additional edge point(s), and the irregular element is evaluated based on the knot interval(s) to generate a smooth spline surface representing the physical object. The smooth spline surface can be viewed and modified in a computer-aided design application, or used directly in an analysis of the physical object, e.g., for stress analysis via iso-geometric analysis.

The addition of edge points can be on several quadrilateral edges representing the feature edge. For example, a first quadrilateral edge can extend to the irregular node from a first direction, and a second quadrilateral edge can extend to the irregular node from a second direction. More particularly, the first quadrilateral edge can be on a first side of the node and the second quadrilateral edge can be on a second side of the node. In an embodiment, a pair of additional edge points can be located on the first quadrilateral edge and a pair of additional edge points can be located on the second quadrilateral edge. Thus, the additional edge points can be on the quadrilateral edges representing the feature edge around the irregular node.

The addition of edge points can be interior from the quadrilateral edge representing the feature edge, adjacent to the irregular node. For example, the edge representing the feature edge can terminate at an edge node, and an interior quadrilateral edge can radiate inward along a face of the quadrilateral mesh from the edge node to the irregular node. In an embodiment, edge points are added on the interior edge between the termination of the edge representing the feature edge and the irregular node. Thus, the additional edge points can be on the surface of the mesh near the irregular node.

The basis functions of the additional edge points can be evaluated using their determined and/or extracted knot interval vectors. For example, knot interval vectors for each of the edge points, and all other nodes in the mesh, can be determined such that a zero knot interval is used at the edge that has additional edge points. The irregular element having the additional edge point can then be evaluated such that the spline surface has C1 continuity along the quadrilateral edge representing the feature edge across the irregular node. Such high continuity can allow for accurate modeling and fast and accurate analysis of the physical object.

The above summary does not include an exhaustive list of all aspects of the present invention. It is contemplated that the invention includes all devices, systems, and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

FIGS. 23-26 depicts systems that may be used in conjunction with the embodiments described herein.

DETAILED DESCRIPTION

Figure 1:
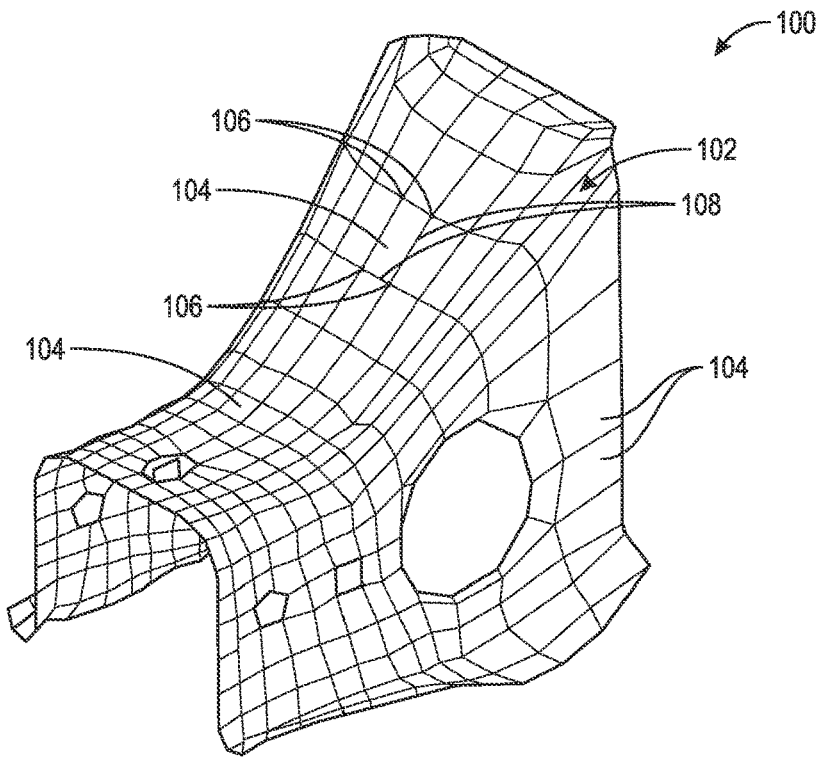
FIG. 1 is a perspective view of a quadrilateral mesh representing a physical object, in accordance with an embodiment.

Embodiments describe a method and system of constructing a smooth spline surface, accurately and efficiently, from an unstructured quadrilateral mesh having irregular node(s) on a feature or boundary of a physical object. The physical object can be a mechanical component of a device or machine. The system and method can be embodied as software running on a server-oriented system or a standalone computer.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment," or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description may denote a relative position or direction. For example, "direction" may indicate a first direction of a coordinate system along a mesh surface. Similarly, "negative direction" may indicate a second direction in an opposite direction from the direction of the coordinate system. Such terms are provided to establish relative frames of reference, however, and are not intended to limit the methods or systems to a specific configuration described in the various embodiments below.

In an aspect, a method and system creates a smooth spline surface from a quadrilateral mesh representing a physical object having arbitrary topology. The physical object includes features, e.g., a sharp edge or a sharp corner, or a boundary on an object surface. The spline surface that is generated from the mesh preserves the feature or the boundary on the surface, and has high continuity along the feature or the boundary. More particularly, the generated spline surface can be a cubic spline surface that is C0 continuous across an edge representing the sharp edge or the sharp corner of the physical object, also known as a feature of the physical object. The spline surface may also be C0 continuous across a 1-ring neighborhood around irregular nodes on the feature or the boundary, and C1 continuous across the 2-ring neighborhood around the interior irregular nodes. The spline surface can be C2 continuous elsewhere. Basis functions of the spline surface can satisfy partition of unity and be linearly independent. The spline surface can include control points on the feature or the boundary to allow for rendering and modifying a design of the physical object in a computer-aided design software application. Furthermore, the spline surface model can be used directly for analysis, e.g., iso-geometric analysis, of the physical object. Accordingly, the generated spline surface can be used for design, e.g., computer-aided design, and/or analysis, e.g., stress analysis, of the physical object.

Referring to FIG. 1, a perspective view of a quadrilateral mesh representing a physical object is shown in accordance with an embodiment. A physical object 100 can be something material, such as a part or component of a device or a machine. The physical object 100 may be, for example, a bracket used to restrain a belt, or another component that undergoes mechanical stress during use. In an embodiment, a structure of the physical object 100 can be described by a quadrilateral mesh 102. The mesh can include quadrilateral elements 104 having nodes 106 interconnected by edges 108. More particularly, each quadrilateral element 104 can be defined by edges 108 that extend between, and meet at, nodes 106. In a spline surface generated from the mesh, the nodes 106 can be used as control points to determine a shape of the spline surface.

Figure 2:
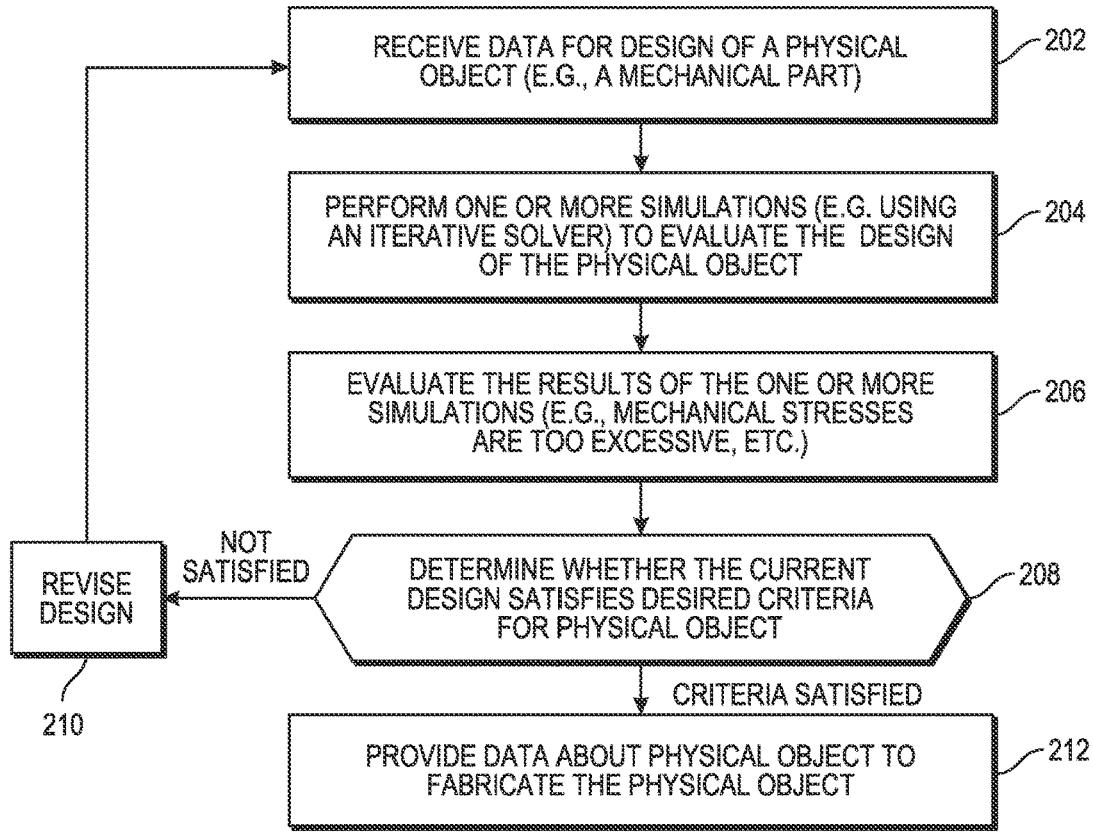
FIG. 2 is a flowchart of a method of generating a design of a physical object, in accordance with an embodiment.

Referring to FIG. 2, a flowchart of a method of generating a design of a physical object is shown in accordance with an embodiment. The embodiments described herein can be used in simulations of the physical object 100 in order to determine whether a particular design of the physical object satisfies particular design requirements, e.g., a predetermined strength. For example, there might be certain design requirements relating to a predetermined number of cyclic loads that the physical object 100 must sustain without failing mechanically. FIG. 2 shows a method in which these design requirements can be tested relative to a particular design of the physical object 100 that is being simulated.

At operation 202 of FIG. 2, a data processing system (e.g., a computer executing simulation software to provide a simulation system) can receive data about a design for a particular physical object 100, e.g., a bracket. This data can be similar to the data inputted into SpaceClaim from Ansys, Inc. of Canonsburg, Pennsylvania. The data can be created in computer-aided design (CAD) software on a data processing system, and the data can include the quadrilateral mesh 102 or a spline surface generated from the quadrilateral mesh 102, as described below.

At operation 204, the data processing system can perform one or more simulations (such as simulations based on spline surface models of the physical object 100) to evaluate the design of the physical object by determining, for example, stress data (such as changes in mechanical stress over time in the physical object) during the simulated operation of the physical object 100.

At operation 206, the designer can evaluate the results of one or more simulations to determine whether the design of the physical object 100 satisfies certain desired criteria for the design. This determination is shown at operation 208. If the one or more criteria is satisfied, then the designer at operation 212 can provide data about the physical object 100 to allow the fabrication or manufacture of the physical object 100. For example, if the one or more criteria are satisfied, a CAD file can be produced that describes how to build the physical object 100. If the criteria are not satisfied as determined in operation 208, the designer can revise the design in operation 210 (for example, by changing a dimension or material of the physical object, etc.) and repeat the process by performing additional further simulations to evaluate the redesigned physical object 100. This can be repeated until the desired criteria are achieved for the physical object 100.

Figure 3:
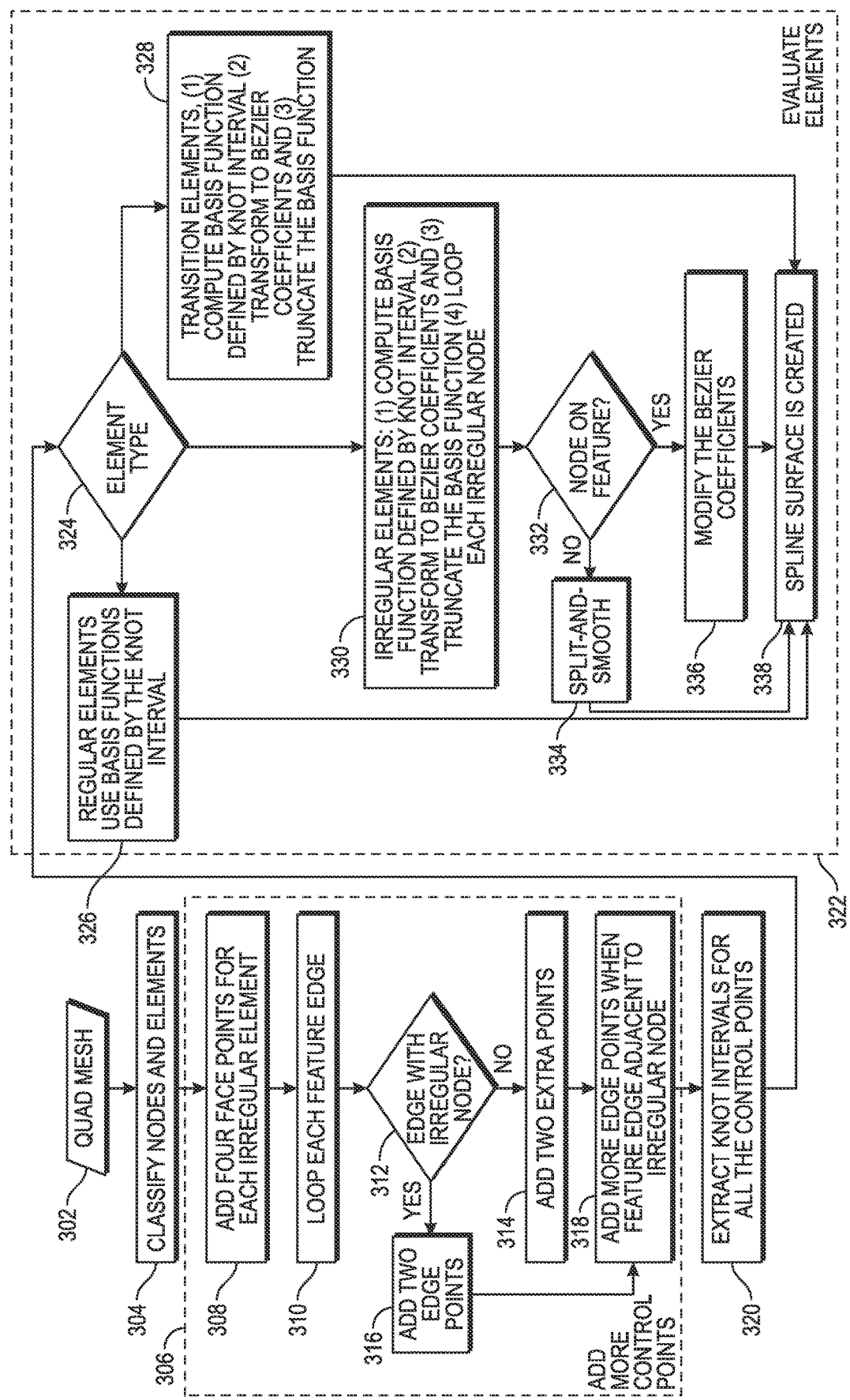
FIG. 3 is a flowchart of a method of generating a spline surface representing a physical object, in accordance with an embodiment.

Referring to FIG. 3, a flowchart of a method of generating a spline surface representing a physical object is shown in accordance with an embodiment. The method includes operations that are illustrated in FIGS. 4-22, and thus, FIGS. 3-22 shall be referred to and described in combination below. An input of the method can be the quadrilateral mesh 102 of the physical object 100. The output of the method can be a smooth spline surface for use in the design method of FIG. 2. The smooth spline surface can have high continuity around irregular nodes on a feature or a boundary of the physical object 100, as described below.

At operation 302, the quadrilateral mesh 102 representing a surface of the physical object 100 is received. For example, the quadrilateral mesh 102 can be an unstructured quadrilateral mesh received by a memory or a processor of a computer system. The quadrilateral mesh 102 includes elements 104, nodes 106, and edges 108. Each element 104 can be defined by four edges 108, which meet at nodes 106. More particularly, the edges 108 can have respective end points, which are nodes 106. The edge nodes can provide points for the quadrilateral mesh. More particularly, the elements 104 can have sets of points, including two edge nodes of each edge 108. The edges 108 extend between the nodes 106. At operation 304, the nodes 106 and the elements 104 of the quadrilateral mesh 102 are classified. The nodes 106 can be categorized into two types of nodes based on their relationship to elements of the mesh. Similarly, the elements 104 can be categorized into three types of elements based on their relationship to nodes of the mesh.

Nodes 106 can be categorized as regular nodes or irregular nodes based on a node location and a valence of the node. Valence of a node is determined based on the number of quadrilateral elements that share the node. In an embodiment, a node 106 is classified as a regular node when the node is located on a boundary of the physical object 100, and the node has a valence of 1 or 2. A node 106 may also be classified as a regular node when the node is located in an interior of the mesh, e.g., inward from a boundary of the physical object 100, and the node has a valence of 4. All other nodes 106, which are not characterized as regular nodes, may be classified as irregular nodes. Irregular nodes can therefore be located on a boundary of the mesh and have valence greater than 2, or may be located in the interior of the mesh and have valence other than 4.

Elements 104 can be categorized as regular elements, transition elements, or irregular elements. In an embodiment, an irregular element is an element 104 of the mesh that has one or more irregular nodes. A transition element can be classified as an element 104 that neighbors an irregular element and is not an irregular element itself. Remaining elements 104, which are neither irregular elements or transition elements, can be classified as regular elements.

At operation 306, additional control points are added to the quadrilateral mesh 102. The operation can be performed in one or more sub-operations (encompassed within the dotted box of the flowchart and also referred to as operations below) to add control points to elements 104 based on a classification of the element and/or a relationship of the element to a feature or a boundary of the mesh representing the physical object 100.

Figure 4:
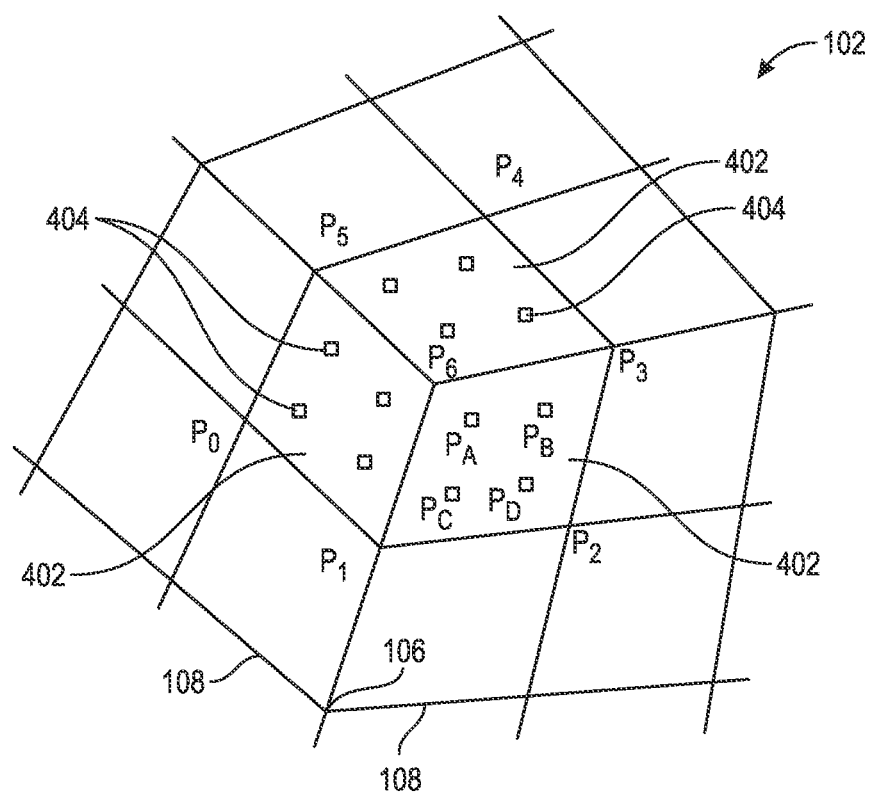
FIG. 4 is a pictorial view of control points on an irregular element, in accordance with an embodiment.

Referring to FIG. 4, a pictorial view of control points on an irregular element is shown in accordance with an embodiment. The quadrilateral mesh 102 can include one or more irregular elements 402. At operation 308, additional face points 404 are added to the irregular element(s) 402. For example, four face points 404 can be added for each irregular element 402. Some of the additional face control points are indicated in FIG. 4, and the additional face points 404 in a first irregular element, and points PA, PB, PC, and PD in a second, adjoining irregular element.

In an embodiment, the quadrilateral mesh 102 includes edges representing a feature or a boundary of the physical object. For example, a quadrilateral edge of the mesh can represent a sharp edge or a sharp corner of the physical object 100. The method may include determining whether an edge of the mesh represents the feature. Such determination can be made based on the dihedral angle between two faces using the edges in the mesh. For example, when an angle of two quadrilateral faces of edges 108 is less than a predetermined value, e.g., less than 120 degrees, the edge 106 may be considered to be an edge representing a sharp feature.

Definition of an edge of the quadrilateral mesh 102 as representing a feature edge of the physical object can be based on selected edges input by a user, or edges satisfying criteria given by a user. The user may use a user interface to input specifications that define mesh edges as representing a feature edge. For example, the user can enter the predetermined value of the angle that results in the edge 108 being considered to be an edge representing a sharp feature. The angle and other predetermined value inputs can be provided to affect whether an edge of the quadrilateral mesh is determined to be representative of a feature edge. Accordingly, the user inputs can determine whether an edge of the quadrilateral mesh is preserved as the feature edge in the spline surface model.

At operation 310, each edge 108 of the mesh that is determined to represent a feature edge of the physical object can be looped over. More particularly, the edges representing the feature edges can be assessed to determine whether and how to add control points corresponding to the feature edge. At operation 312, an edge 108 of the quadrilateral mesh 102, which represents a feature, e.g., a sharp edge, of the physical object 100, is assessed to determine whether the edge 108 has an irregular node. More particularly, it may be determined whether an irregular node is on the edge 108.

Figure 5:
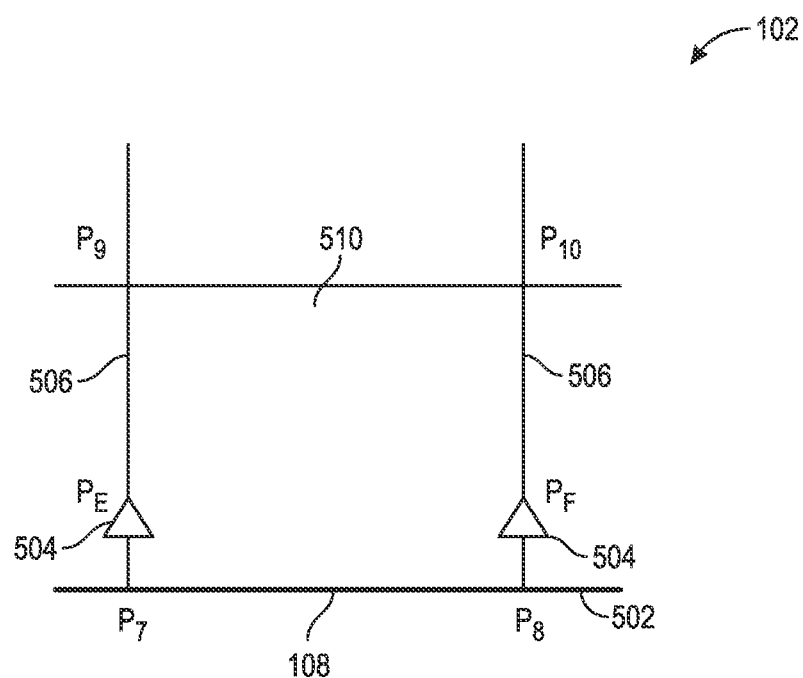
FIG. 5 is a pictorial view of control points on a regular element having a quadrilateral edge representing a feature edge, in accordance with an embodiment.

Referring to FIG. 5, a pictorial view of control points on a regular element having an edge representing a feature edge is shown in accordance with an embodiment. The feature 502 of the physical object is represented as a bold line. The feature 502 may, for example, be a sharp edge of the physical object. The regular element 510 can include an edge 108 representing the feature edge 502 and extending between nodes at P7 and P8. At operation 314, when the looped over edge 108 does not have an irregular node, extra control points 504 can be added around the edge 108 representing the feature or the boundary. More particularly, an extra control point 504 may be added to one or more of the quadrilateral edges 506 that extend from the feature edge 108 (the edge between nodes P7 and P8). For example, the regular element 510 can include quadrilateral edges P7-P9 and P8-P10 intersecting the edge 108 representing the feature edge that extends through P7-P8. The edge 108 representing the feature edge 502 has no irregular node, and thus, two extra control points 504 (PE and PF) can be added to the quadrilateral edges 506 adjacent to the edge 108 representing the feature edge 502.

Figure 6:
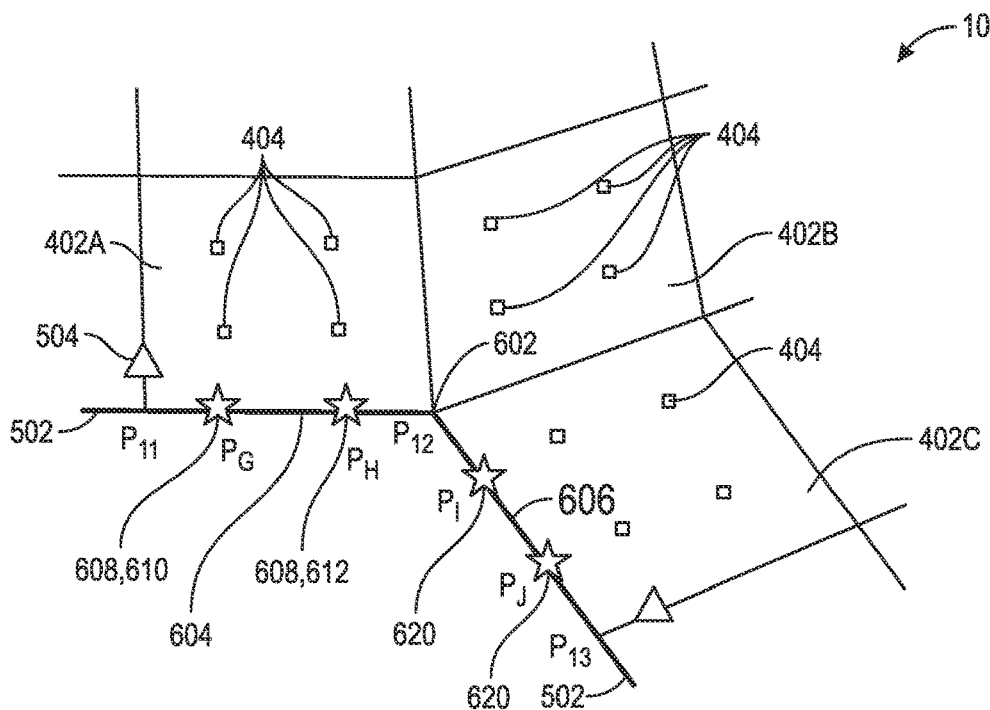
FIG. 6 is a pictorial view of edge points on a quadrilateral edge representing a feature edge, in accordance with embodiment.

Referring to FIG. 6, a pictorial view of edge points on an edge representing a feature edge is shown in accordance with embodiment. The quadrilateral mesh 102 can include an irregular element 402A having an irregular node 602 on a first quadrilateral edge 604. The first quadrilateral edge 604 can represent a feature edge 502 of the physical object 100. For example, the feature edge 502 can be a sharp edge extending along an internal fillet of the physical object 100. The first quadrilateral edge 604 can include an edge segment (P11-P12) that extends from the irregular node 602 in a first direction. Similarly, the quadrilateral mesh 102 can include an irregular element 402C having a second quadrilateral edge 606 representing the feature edge 502 of the physical object 100. The second quadrilateral edge 606 can include an edge segment (P12-P13) that extends from the irregular node 602 in a second direction. More particularly, the first quadrilateral edge 604 can meet the second quadrilateral edge 606 at the irregular node 602.

At operation 316, when the looped over edge does have an irregular node 602, more edge points 608 are added to the quadrilateral mesh 102. More particularly, edge points 608 may be added to the quadrilateral edge representing the feature edge 502 (or boundary) of the quadrilateral mesh 102. For example, in response to determining that the first quadrilateral edge 604 includes the irregular node 602, a first edge point 610 is added to the first edge 604. The addition of edge points 608 to the first edge 604 may also include adding a second edge point 612 on the first edge 604. The edge points 608 can be initially located on the quadrilateral edge representing the feature edge 502. The edge points 608 are freely relocatable control points. The control points can be repositioned during a surface fitting or design modification process.

The first edge point 610 and the second edge point 612 can be on the first quadrilateral edge 604, as shown in FIG. 6. The first edge point 610 and the second edge point 612 may constitute a first plurality of edge points. In an embodiment, a second plurality of edge points 620 may be added to the second quadrilateral edge 606 representing the feature edge 502 on an opposite side of the irregular node 602 from the first quadrilateral edge 604. More particularly, the second plurality of edge points 620 may be added on the second quadrilateral edge 606.

Figure 7:
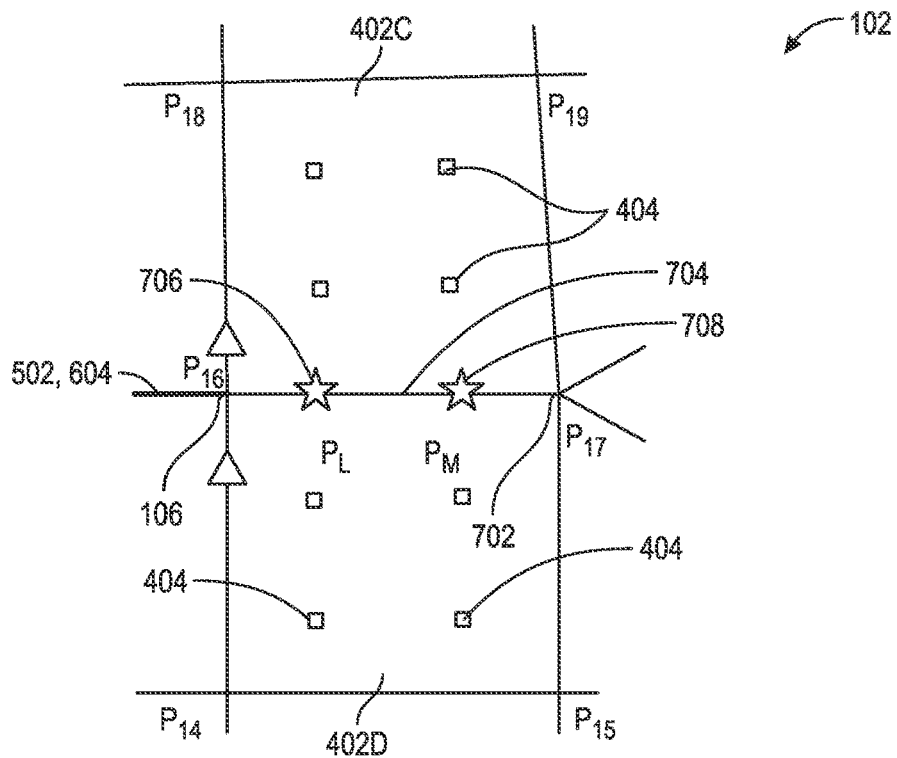
FIG. 7 is a pictorial view of edge points on an edge, in accordance with an embodiment.

Referring to FIG. 7, a pictorial view of edge points on an edge is shown in accordance with an embodiment. In addition to adding extra control points at operation 314 and/or adding edge points on edges representing feature edges or boundaries at operation 316, control points may be added on edges adjacent to an edge representing a feature edge 502 of the physical object (bold line). At operation 318, one or more edge points 608 are added when the edge representing the feature edge 502 is adjacent to an irregular node.

Still referring to FIG. 7, the edge representing the feature 502 can terminate at a regular node 106 (P16). In an embodiment, a second irregular node 702 is located near the termination of the edge representing the feature 502. More particularly, the quadrilateral mesh can include a second edge 704 extending from the edge representing the feature 502 to the second irregular node 702. The second edge 704 can extend inward from the edge 604 into the interior of the quadrilateral mesh. Accordingly, the second irregular node 702 may be in the interior of the quadrilateral mesh 102. In an embodiment, the addition of control points includes adding a third edge point 706 on the second edge 704. Similarly, a fourth edge point 708 may be added on the second edge 704 adjacent to the third edge point 706. The addition of edge points 608, 708 in the operations described above can satisfy partition of unity.

At operation 320, after adding extra control points (e.g., face points 404 and edge points 608, 708) around the irregular nodes 602 of the quadrilateral mesh 102, basis functions are built for each control point. Generation of the basis functions can include determining a knot interval vector. A knot interval is the parametric length of one edge, and using degree 3, a knot interval vector contains four knot intervals. More particularly, knot interval vectors of the control points of the quadrilateral mesh 102 are extracted. For example, knot interval vectors of the first edge point 610 can be determined, along with knot intervals for all other control points of the quadrilateral mesh 102. Extraction criteria of the knot intervals can be based on the node type, e.g., whether the node is a regular node, an extra control point, an edge point, etc. The extraction criteria is described further below.

Figure 8:
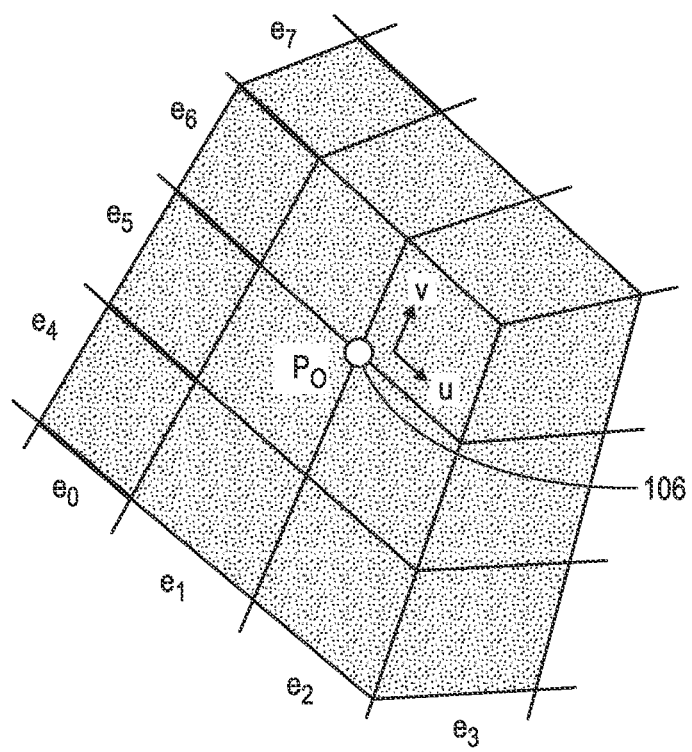
FIG. 8 is a pictorial view of a regular node, in accordance with an embodiment.

Referring to FIG. 8, a pictorial view of a regular node is shown in accordance with an embodiment. In the figure, e0, e1, etc. represent a knot interval (parametric length) of the edge. In each quadrilateral element, opposite edges always share the same parametric length. For example, in FIG. 8, all the edges highlighted as bold lines have the same knot interval, e0. When determining a knot interval of a regular node 106 (P0) a ray can be shot along each parametric direction. The parametric directions are shown as direction U and direction V in the figure. Two layer elements can be found in each of the directions. For example, the two layer elements in the U direction around P0 gives a knot interval vector of [e0, e1, e2, e3]. In the V direction, the knot interval vector for P0 is [e4, e5, e6, e7].

Figure 9:
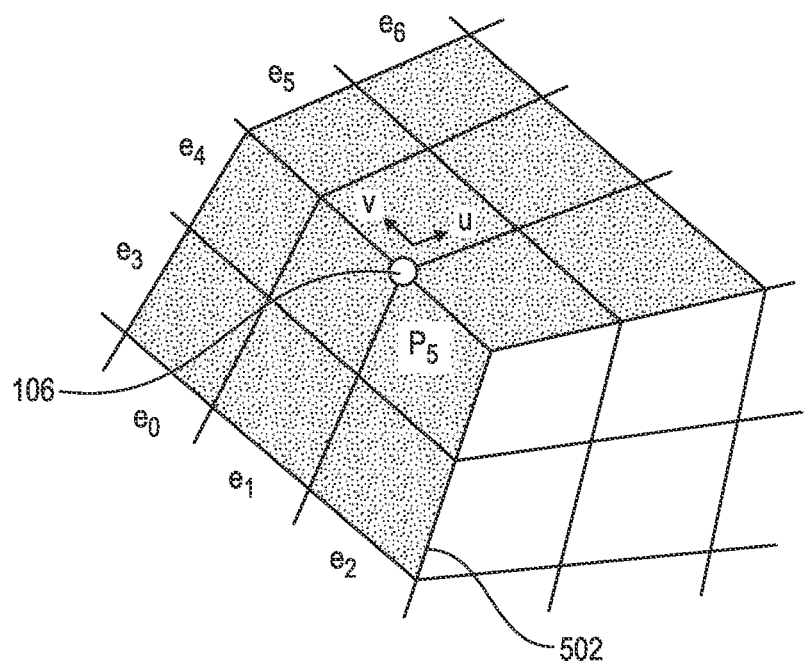
FIG. 9 is a pictorial view of a regular node, in accordance with an embodiment.

Referring to FIG. 9, a pictorial view of a regular node is shown in accordance with an embodiment. Determination of a knot interval vector for a regular node 106 may differ, as compared to the criteria illustrated in FIG. 8, when the two layer elements in a direction meet a feature, a boundary or irregular node of the mesh. More particularly, if the two layer elements in a direction from the subject node 106 meet a boundary or a feature, then the knot interval may be zero. Taking the regular node P5 as an example, the knot interval vector is [e3, e4, e5, e6] in the U direction, however, in the V direction the knot interval vector is [0, e2, e1, e0]. It is seen that the 2-ring neighborhood around P5 meets an irregular node in the V direction, and thus, the knot interval is zero at the feature/boundary.

Figure 10:
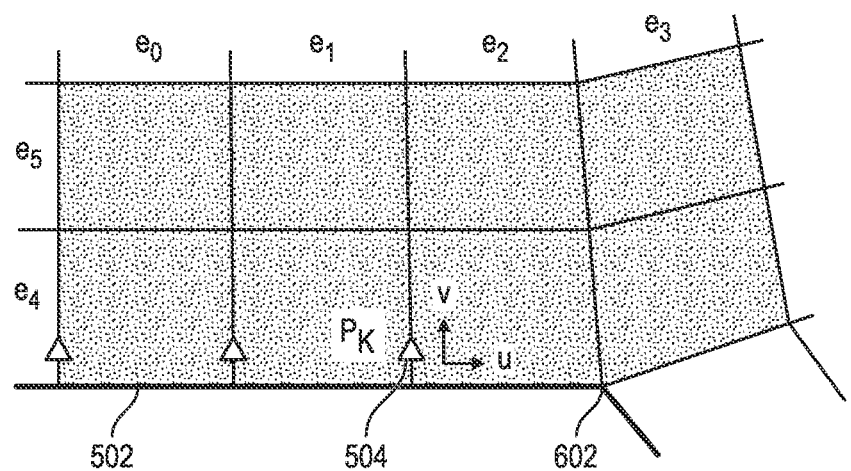
FIG. 10 is a pictorial view of an extra node, in accordance with an embodiment.

Referring to FIG. 10, a pictorial view of an extra node is shown in accordance with an embodiment. Similar to the special case of a feature/boundary or irregular node existing within the 2-ring neighborhood of a regular node 106, a knot interval of zero is also used when meeting features/boundaries or irregular node for extra control points 504. Similarly, a knot interval of zero may be determined when the neighborhood around the regular node 106 or additional control point meets an irregular node 602. The case of FIG. 10 shows additional control point PK, which is in the neighborhood of both the edge representing the feature edge 502 and the irregular node 602. In the U direction, a knot interval vector of PK can be [e0, e1, e2, 0], where the zero knot interval value derives from the neighborhood meeting the irregular node 602. Similarly, in the V direction, a knot interval vector of PK can be [0, 0, e4, e5], where the two zeros are determined for the edge representing the feature edge 502 that is in the negative V direction from PK. Accordingly, for regular nodes and extra control points, a knot interval of zero is used when meeting a boundary/feature or an irregular node 602.

Extraction criteria for face nodes 106, such as the face points 404 added to irregular elements 402, may also be based on whether a feature/boundary is within a neighborhood of the control point. The neighborhood may, however, be based on a 1-ring neighborhood around the node rather than a 2-ring neighborhood around the node. More particularly, in an embodiment, for face nodes the basis function support is the 1-ring neighborhood of the corner node which the face node is associated with. A knot interval of zero is used at an element edge and another zero knot interval is also used if an element edge is on a boundary/feature, or if the element edge includes edge nodes.

Figure 11:
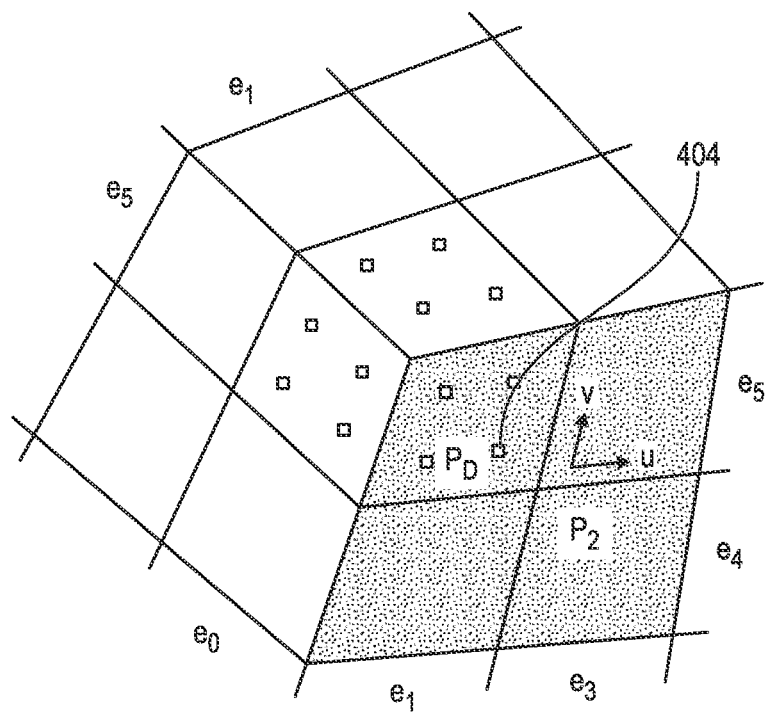
FIG. 11 is a pictorial view of a face node, in accordance with an embodiment.

Referring to FIG. 11, a pictorial view of a face node is shown in accordance with an embodiment. The extraction criteria applied to face point 404 (PD) can determine the shaded region as the basis function support domain for the node 404. More particularly, the face node PD can be associated with the corner node P2, and the 1-ring neighborhood around the corner node P2 is shaded. A knot interval vector in the U direction within the shaded region can be [0, e1, 0, e3]. Similarly, a knot interval vector in the V direction within the shaded region can be [e4, 0, e5, 0].

Figure 12:
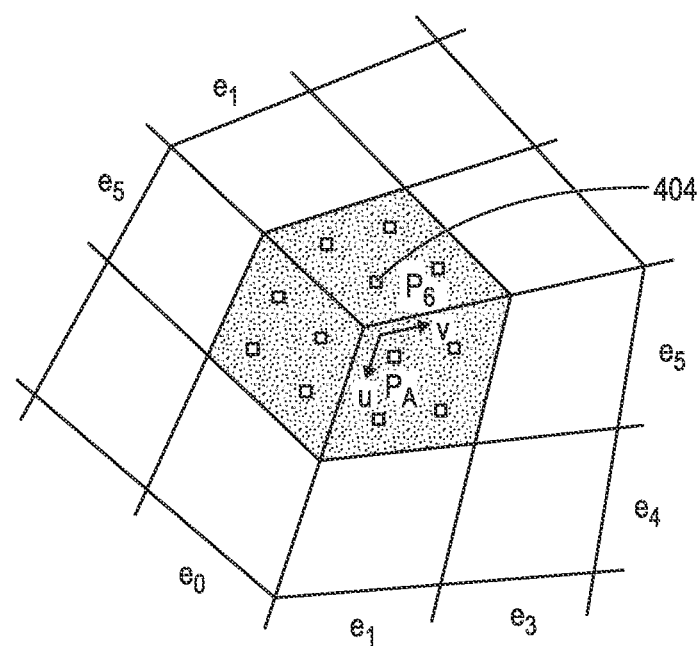
FIG. 12 is a pictorial view of a face node, in accordance with an embodiment.

Referring to FIG. 12, a pictorial view of a face node is shown in accordance with an embodiment. The face node 404 (PA) can be associated with the corner node P6. The shaded region represents the 1-ring neighborhood around the corner node P6. A knot interval vector in the U direction within the shaded region can be [e0, 0, e5, 0]. Similarly, a knot interval vector in the V direction within the shaded region can be [e0, 0, e1, 0]. Accordingly, for face nodes, a knot interval of zero is used at an element edge and another zero knot interval is also used if one element edge is on a boundary/feature or the edge has an edge node.

Extraction criteria for edge nodes, such as the edge points 608 added on and around feature edges representing the feature 502 having irregular nodes 602, may also be based on whether a feature/boundary is within a neighborhood of the control point. The neighborhood may be based on a 1-ring neighborhood around the edge node. More particularly, in an embodiment, for edge nodes the basis function support is the 1-ring neighborhood of the corner node which the edge node is associated with. A knot interval of zero is used at an element edge and another zero knot interval is also used if an element edge meets an irregular node 602, if the element edge is on a boundary/feature, or if the element edge includes edge nodes.

Figure 13:
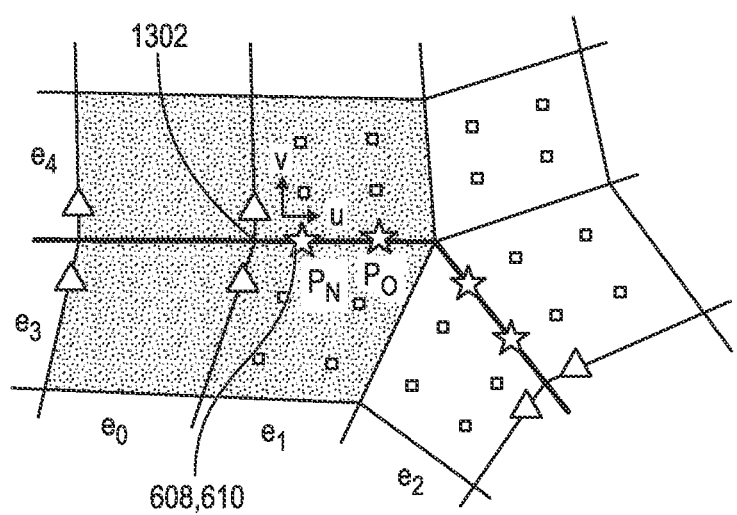
FIG. 13 is a pictorial view of an edge node, in accordance with an embodiment.

Referring to FIG. 13, a pictorial view of an edge node is shown in accordance with an embodiment. The extraction criteria applied to edge point 608 (PN) can determine the knot interval. In an embodiment, edge point PN is the first edge point 610 (FIG. 6). The first edge point 610 can be associated with the corner node 1302, and the 1-ring neighborhood around the corner node 1302 is shaded. A knot interval vector in the U direction within the shaded region can be [e0, 0, e1, 0]. Similarly, a knot interval vector in the V direction within the shaded region can be [e3, 0, 0, e4]. Accordingly, the knot interval vector of the first edge point 610 may have two zero knot intervals.

Figure 14:
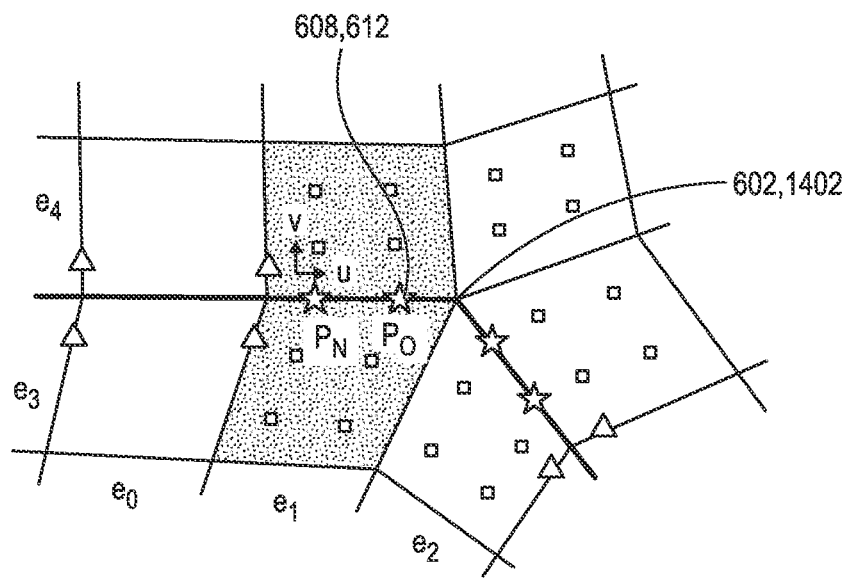
FIG. 14 is a pictorial view of an edge node, in accordance with an embodiment.

Referring to FIG. 14, a pictorial view of an edge node is shown in accordance with an embodiment. The extraction criteria applied to edge point 608 (P0) can determine the knot interval. In an embodiment, edge point P0 is the second edge point 612 (FIG. 6). The second edge point 612 can be associated with the corner node 1402, which may be the irregular node 602. A 1-ring neighborhood around the corner node 1402 is shaded. A knot interval vector in the U direction within the shaded region can be [0, e1, 0, 0]. Similarly, a knot interval vector in the V direction within the shaded region can be [e3, 0, 0, e4]. Accordingly, for edge nodes, a knot interval of zero is used at an element edge and another zero knot interval is also used if the extraction direction meets an irregular node 602, if one element edge is on a boundary/feature, or if the edge has an edge node.

At operation 322, the elements of the quadrilateral mesh 102 are evaluated to generate the smooth spline surface. The sub-operations (within the dotted box and also referred to as operations below) may apply different evaluation techniques to the elements, based on a type of element that is being evaluated. Accordingly, at operation 324, a determination is made as to what type of element is being evaluated in the quadrilateral mesh 102. As described above, the elements 104 may be classified as regular elements, transition elements, or irregular elements. Accordingly, the regular elements, transition elements, and/or irregular elements may be evaluated based on the determined knot interval vector, as described below, to generate a spline surface representing the physical object 100.

At operation 326, for regular elements, the basis functions defined by the determined knot interval vector are used to evaluate the element. The local spline is defined as $S^e(u,v) = \Sigma_i P_i B_i(u,v)$, where $P_i$ is one collected control point and $B_i(u,v)$ is the basis function defined by the knot interval vector of $P_i$. All of the regular nodes and extra control points of the regular element being evaluated can be collected. In an embodiment, the regular nodes and extra control points of elements neighboring the regular element being evaluated can also be collected. The regular element may be evaluated by summing all of the collected nodes multiplied by their basis function.

At operation 328, for a transition element, the regular nodes and extra control points in the transition element and its neighboring elements can be collected. Furthermore, the face and edge nodes in those elements can be collected. The basis functions defined by the determined knot interval vectors for the nodes are used to evaluate the element. In an embodiment, the basis functions are transformed to Bezier coefficients. In other words, each basis function is represented by using 16 Bezier coefficients, and then the basis function is rewritten as a linear combination of the 16 Bezier basis in degree 3. The basis functions of the collected regular nodes and extra control points can be truncated using the basis functions of the collected face and edge nodes, if they are children. The truncation formula is trunB=B−$\Sigma_{B_i \in child(B)} c_i B_i'$, where B is one basis function of regular/extra node, $B_i'$ is one basis function of face/edge node, and $c_i$ is the transformation coefficient. The transition element may be evaluated by summing all of the collected nodes with truncated basis functions.

At operation 330, for an irregular element, an evaluation procedure similar to that described for the transition element above, is used. The nodes of the irregular element and some of its neighboring elements are collected. Neighboring elements sharing one irregular node with the irregular element are skipped, however. Furthermore, the face and edge nodes in the selected elements can be collected. The basis functions defined by the determined knot intervals for the nodes are used to evaluate the element. In an embodiment, the basis functions are transformed to Bezier coefficients. The basis functions of the collected nodes can be truncated using the basis functions of the collected face and edge nodes, if they are children. Each irregular node of the irregular element is then looped over.

At operation 332, it is determined whether the irregular node is on an edge of the quadrilateral mesh 102 representing a feature/boundary. Evaluation of the irregular element can depend on such determination.

At operation 334, if one irregular node is not on an edge of the mesh representing a feature/boundary, then all of the face and edge nodes in the neighboring element of the irregular nodes can be added. A split-and-smooth for all the basis functions can then be used to improve the continuity to C1 continuity around the irregular node. The split-and-smooth will modify the Bezier coefficients of the irregular elements. The split-and-smooth technique is described further in Xiaodong Wei et al. (Jan. 6, 2022) "Analysis-Suitable Unstructured T-Splines: Multiple Extraordinary Points Per Face." Comput. Methods Appl. Mech. Engrg. 391 (2022) 114494, the contents of which are incorporated herein by reference.

At operation 336, if one irregular node is on an edge of the mesh representing a feature/boundary, then Bezier coefficients are modified based on such location. More particularly, as described below, the Bezier coefficients used in evaluating the irregular element can depend on whether the irregular node is at a location representing a corner of the feature edge 502.

Figure 15:
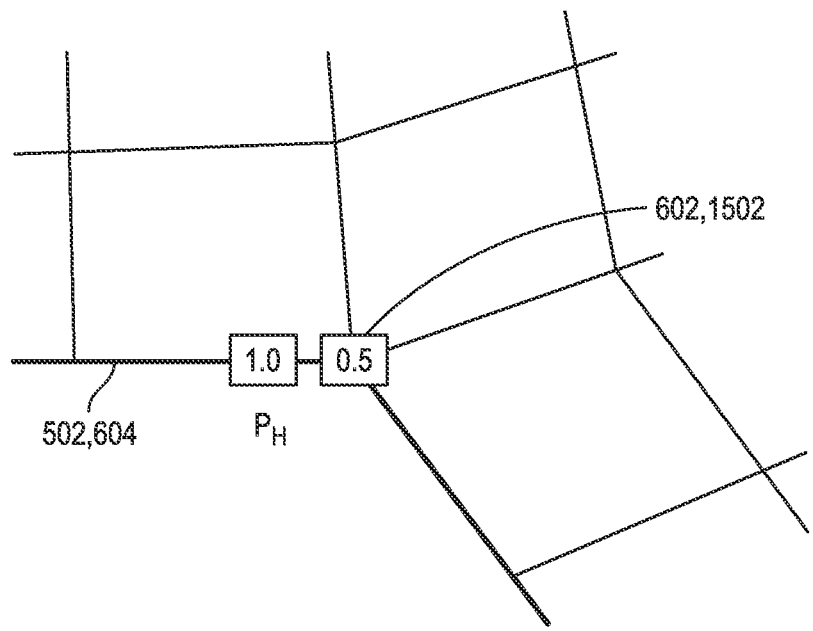
FIG. 15 is a pictorial view of a non-corner node, in accordance with an embodiment.

Referring to FIG. 15, a pictorial view of a non-corner node is shown in accordance with an embodiment. The irregular node 602 may be on the feature edge 502, and may be a non-corner node. More particularly, the irregular node 602 may be on the first edge 604 (FIG. 6). The non-corner node, however, may not represent a sharp corner of the physical object 100. For example, the angles between edges meeting at the non-corner node may not meet a predetermined angular threshold used to define a sharp corner of the physical object 100. In such case, when the irregular node 602 is on the first edge 604 at the location not representing a corner of the feature edge 502, the irregular node 602 can have a zero Bezier coefficient. Furthermore, the edge node PH can have a non-zero Bezier coefficient as shown in FIG. 15. In an embodiment, the edge node PH can have a non-Bezier coefficient of 1.0 and 0.5. Irregular nodes evaluated in such a manner may not be control points and may not have basis functions.

Figure 16:
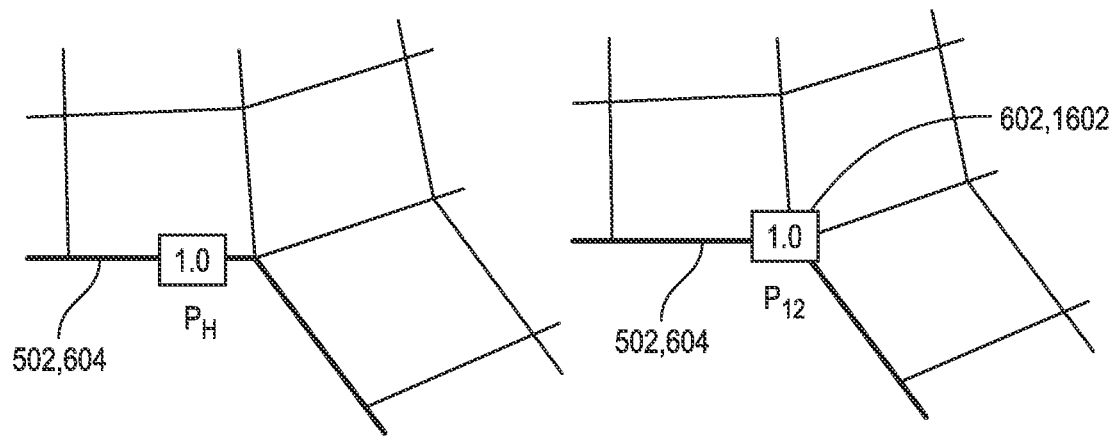
FIG. 16 is a pictorial view of a corner node, in accordance with an embodiment.

Referring to FIG. 16, a pictorial view of a corner node is shown in accordance with an embodiment. The irregular node 602 (P12) may be a corner node. More particularly, the irregular node 602 may be at a location, e.g., on the first edge 604, representing a corner 1602 of the feature edge 502. The corner 1602 of the feature edge 502 can represent a sharp corner of the physical object 100. For example, the corner 1602 can meet the angular threshold between converging edges 108 to define the corner 1602 as a sharp corner in the physical object 100.

When the irregular node 602 (P12) is at the location representing the corner 1602, the irregular node PH can have one non-zero Bezier coefficient. For example, the irregular node PH can have a Bezier coefficient of 1.0. Similarly, the irregular node P12 can be treated as a corner control point and can have its own basis function. In an embodiment, the Bezier coefficient of the irregular node P12 at the corner 1602 is 1.0.

At operation 338, the evaluated elements 104 are used to create a smooth spline surface. The spline surface is defined by the sum of the control points modified by their basis functions, according to the techniques described above. The additional control points on and around edges representing the feature edge 502 can be added to preserve the feature of the physical object in the model.

Figure 17:
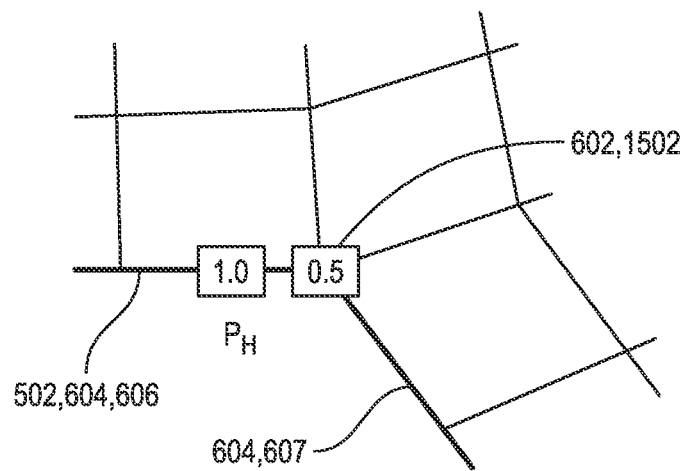
FIG. 17 is a pictorial view of continuity across an irregular node, in accordance with embodiment.

Referring to FIG. 17, a pictorial view of continuity across an irregular node is shown in accordance with embodiment. The spline surface can have good continuity along the feature boundary across the irregular node 602. The C1 continuity condition for a Bezier curve is for the two Bezier curve. More particularly, the shared Bezier coefficients can provide C1 continuity based on the average of the two neighboring Bezier coefficients. In the illustration, the neighboring Bezier coefficients are 1.0 for point PH and 0.5 at the non-corner 1502. Accordingly, along the feature edge representing the feature 502, the edge nodes have non-zero Bezier coefficients and both satisfy the average condition 0.5=(1.0+0)/2. The continuity is C1 continuity. C1 continuity may be defined as continuity in which tangent vectors of two segments, e.g., the first quadrilateral edge 604 and the second quadrilateral edge 606, are equal in magnitude and direction (share the same parametric derivatives).

Figure 18:
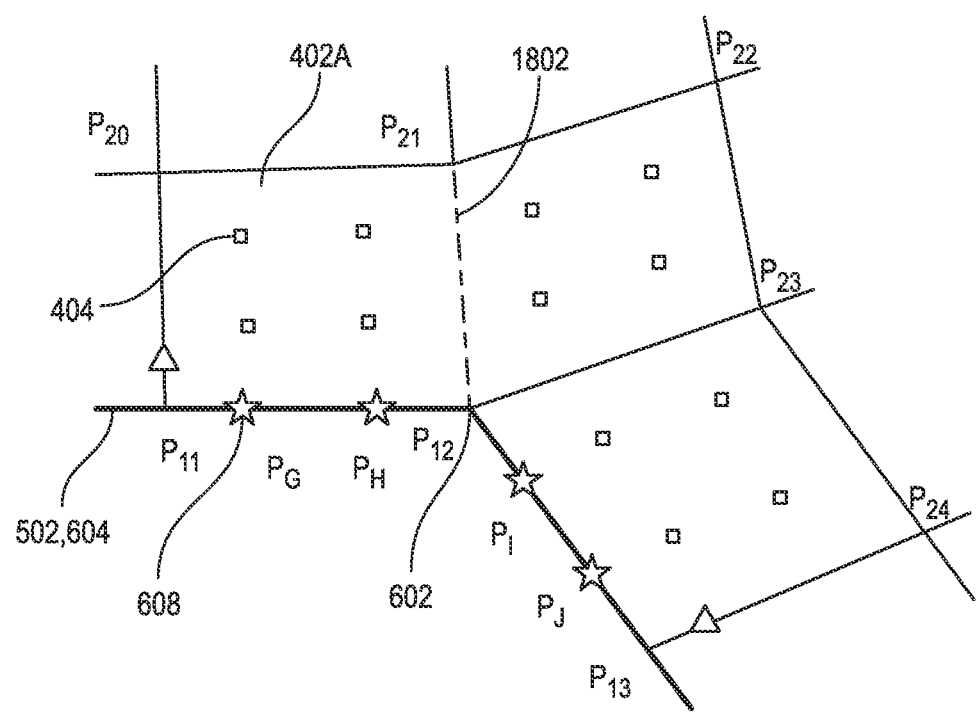
FIG. 18 is a pictorial view of continuity across an edge of an irregular node, in accordance with an embodiment.

Referring to FIG. 18, a pictorial view of continuity across an edge of an irregular node is shown in accordance with an embodiment. Based on the techniques described above, basis functions of irregular nodes 602 on the feature edge representing the feature 502 have knot intervals that include two zeroes. More particularly, after adding extra nodes 404 and edge nodes 608 to the irregular elements 402, e.g., 402A, the extracted knot intervals include zeroes at the feature/boundary. Accordingly, the continuity across the edge representing the feature edge 502, e.g., in a direction orthogonal to the edge representing the feature edge 502, can be C0 continuity. C0 continuity may be defined as continuity in which the curves share the same point where they join.

Continuity across a 1-ring edge 1802 of the irregular node 602 can also be C0 continuity. For example, across the 1-ring edge 1802 (P2-P12) if the irregular node 602 (P12) is at the corner 1602, then the basis functions of PH, P12, and PI are C0 continuity across the edge. Alternatively, if the irregular node 602 (P12) is at the non-corner 1502, the node P12 does not have a basis function. In such case, the basis function of PH is C1 continuity across the edge, and the basis function of PI is C0 continuity across the 1-ring edge 1802. It will be appreciated then that the spline surface that is generated can have C1 continuity along the edge representing the feature edge 502 across the irregular node 602.

Figure 19:
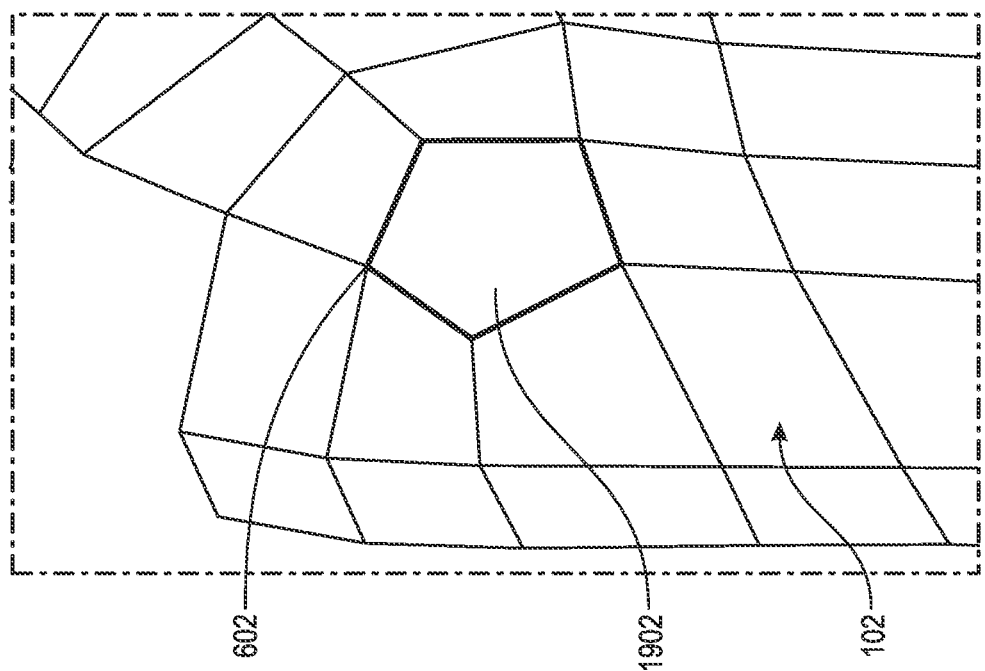
FIG. 19 is a pictorial view of a quadrilateral mesh representing a physical object, in accordance with embodiment.

Referring to FIG. 19, a pictorial view of a quadrilateral mesh representing a physical object is shown in accordance with embodiment. The quadrilateral mesh 102 received by the system at operation 302 can include a mesh that has an irregular node 602 at a location representing the edge of a round hole 1902 in the physical object 100. By inspection, it is apparent that the hole 1902 in the quadrilateral mesh 102 is not accurately represented. More particularly, rather than being round, the hole 1902 is represented as a pentagon.

Figure 20:
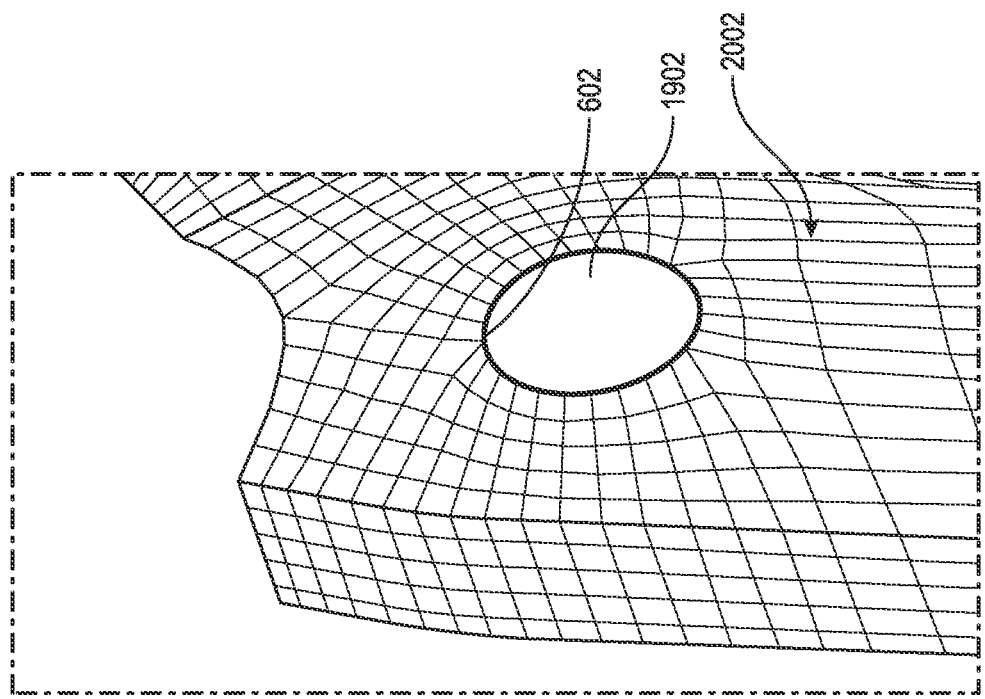
FIG. 20 is a pictorial view of a spline surface representing a physical object, in accordance with embodiment.

Referring to FIG. 20, a pictorial view of a spline surface representing a physical object is shown in accordance with embodiment. The spline surface 2002 generated at operation 338 can more accurately represent the physical object 100. In an embodiment, the spline surface 2002 is displayed, e.g., by a display of a computer system. A quadrilateral mesh 102 having additional control points around the irregular node 602 can represent the hole 1902 in the physical object 100. As shown, the increased smoothness obtained using the techniques above can more accurately represent the hole 1902 as a round hole, rather than a pentagon.

Figure 21:
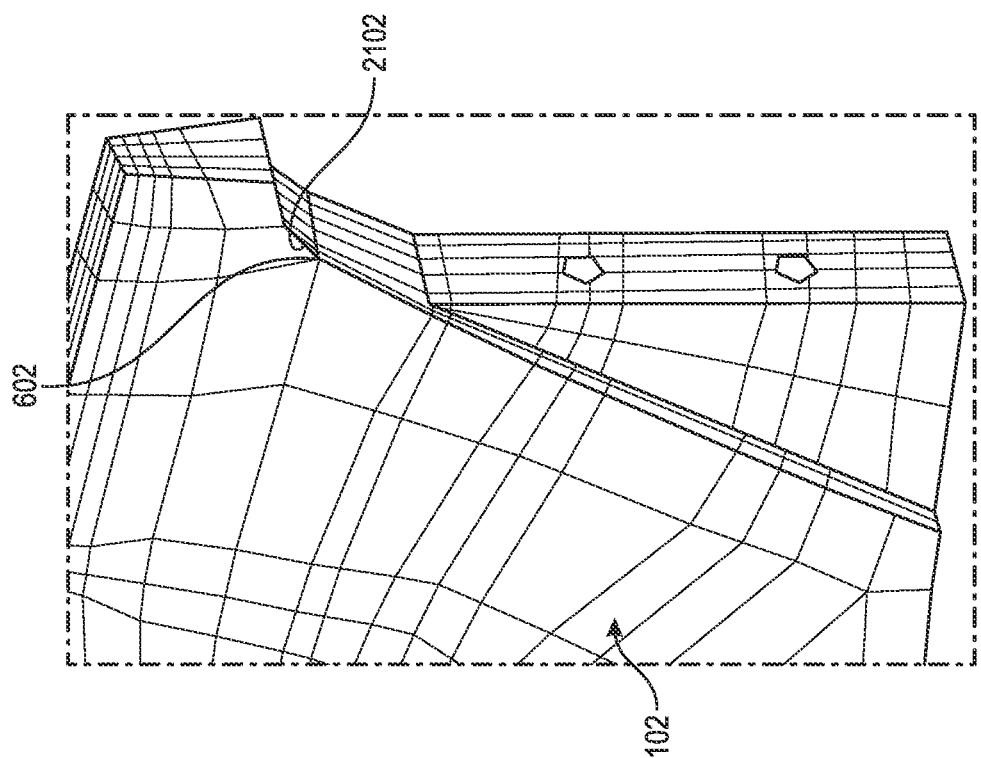
FIG. 21 is a pictorial view of a quadrilateral mesh representing a physical object, in accordance with embodiment.

Referring to FIG. 21, a pictorial view of a quadrilateral mesh representing a physical object is shown in accordance with embodiment. The quadrilateral mesh 102 received by the system at operation 302 can include a mesh that has an irregular node 602 at a location representing the edge of a fillet 2102 in the physical object 100. By inspection, it is apparent that the fillet 2102 in the quadrilateral mesh 102 is not accurately represented. More particularly, rather than being a curved feature, the fillet 2102 is represented as a beveled edge.

Figure 22:
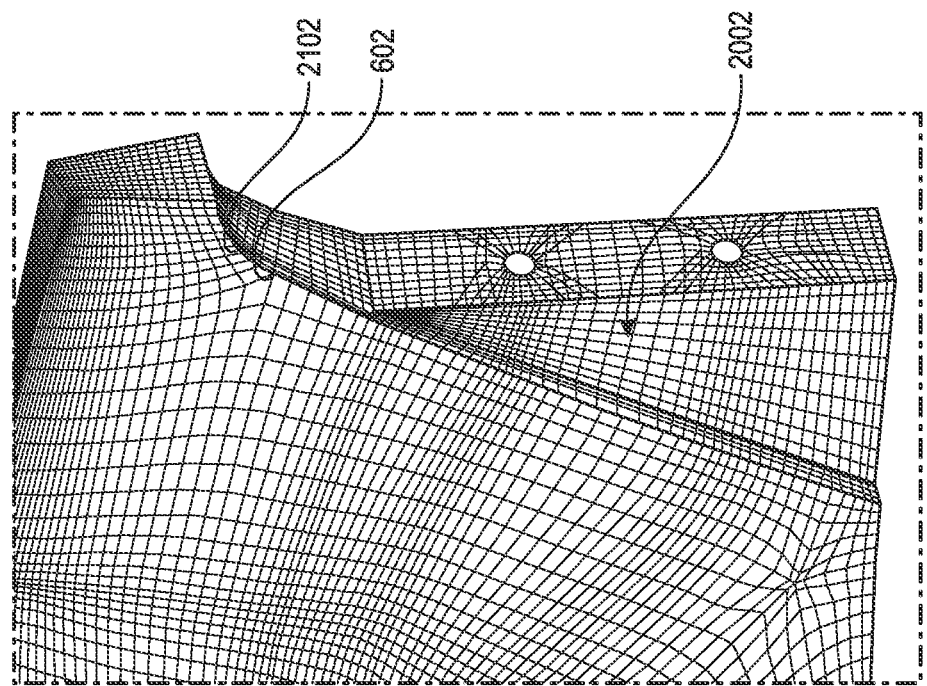
FIG. 22 is a pictorial view of a spline surface representing a physical object, in accordance with embodiment.

Referring to FIG. 22, a pictorial view of a spline surface representing a physical object is shown in accordance with embodiment. The spline surface 2002 generated at operation 338 can more accurately represent the physical object 100. In an embodiment, the spline surface 2002 is used directly in analysis, such as in iso-geometric analysis. The spline surface 2002 can be used to perform a simulation to evaluate the physical object 100. Accordingly, the spline surface 2002, which more accurately represents the fillet 2102, will result in more accurate simulation results. The simulation may also be performed faster because the spline surface 2002 can be used directly in the simulation, rather than relying on secondary mathematical techniques to obtain the necessary continuity.

The methods and systems described herein may be implemented using any suitable processing system with any suitable combination of hardware, software and/or firmware, such as described below with reference to the non-limiting examples of FIGS. 23-26.

Figure 23:
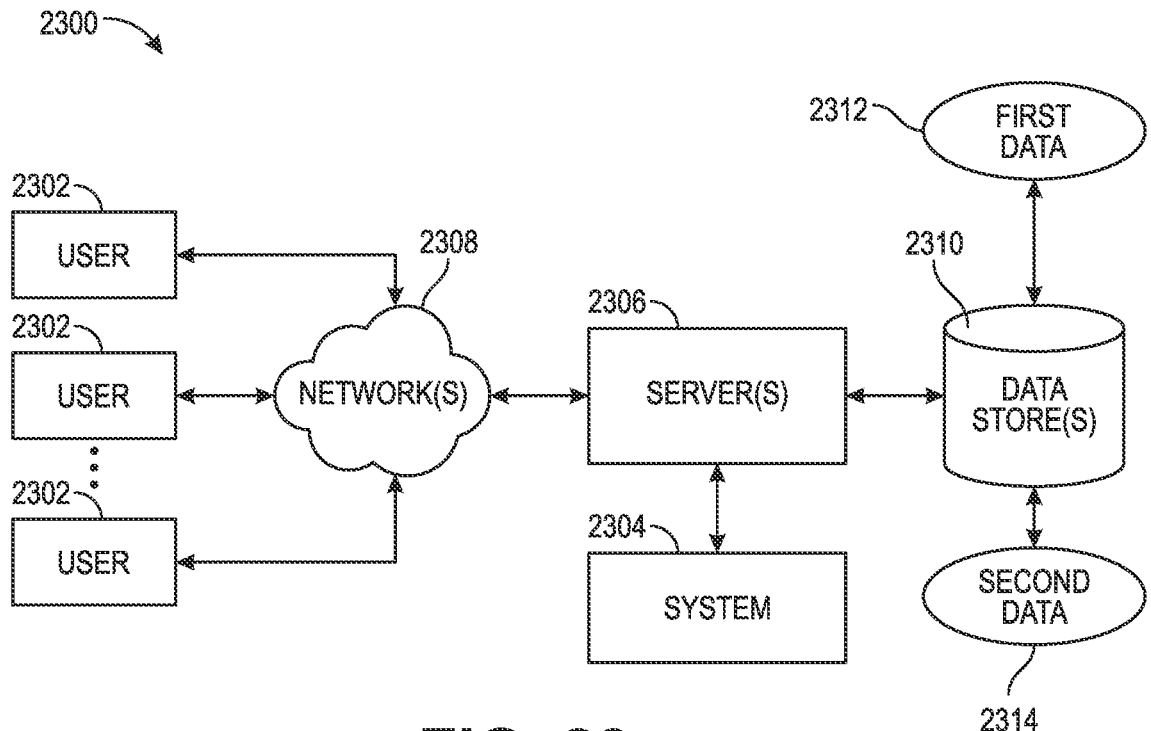

Referring to FIGS. 23, a system that may be used in conjunction with the embodiments described herein is shown. FIG. 23 depicts at 2300 a computer-implemented environment wherein users 2302 can interact with a system 2304 hosted on one or more servers 2306 through a network 2308. The system 2304 contains software operations or routines. The users 2302 can interact with the system 2304 through a number of ways, such as over one or more networks 2308. One or more servers 2306 accessible through the network(s) 2308 can host system 2304. The servers 2306 can have access to data stores 2310. The one or more data stores 2310 may contain first data 2312 as well as second data 2314. It should be understood that the system 2304 could also be provided on a stand-alone computer for access by a user.

Figure 24:
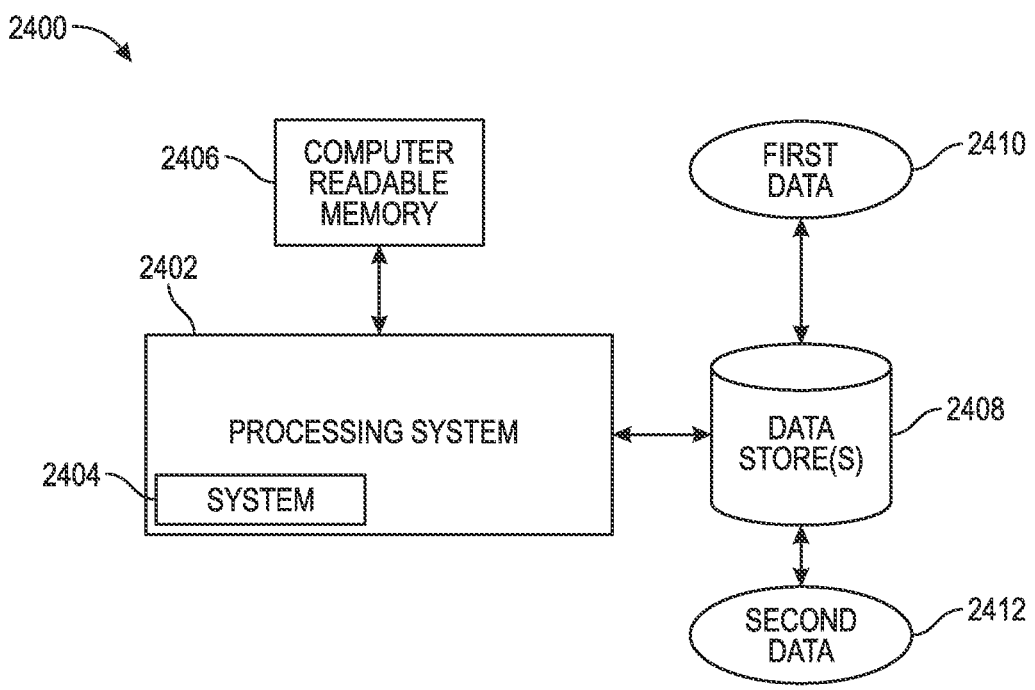

Referring to FIGS. 24, a system that may be used in conjunction with the embodiments described herein is shown. FIG. 24 depicts an exemplary system 2400 that includes a standalone computer architecture where a processing system 2402 (e.g., one or more computer processors) includes a system 2404 being executed on it. The processing system 2402 has access to a non-transitory computer-readable memory 2406 in addition to one or more data stores 2408. The one or more data stores 2408 may contain first data 2410 as well as second data 2412.

Figure 25:
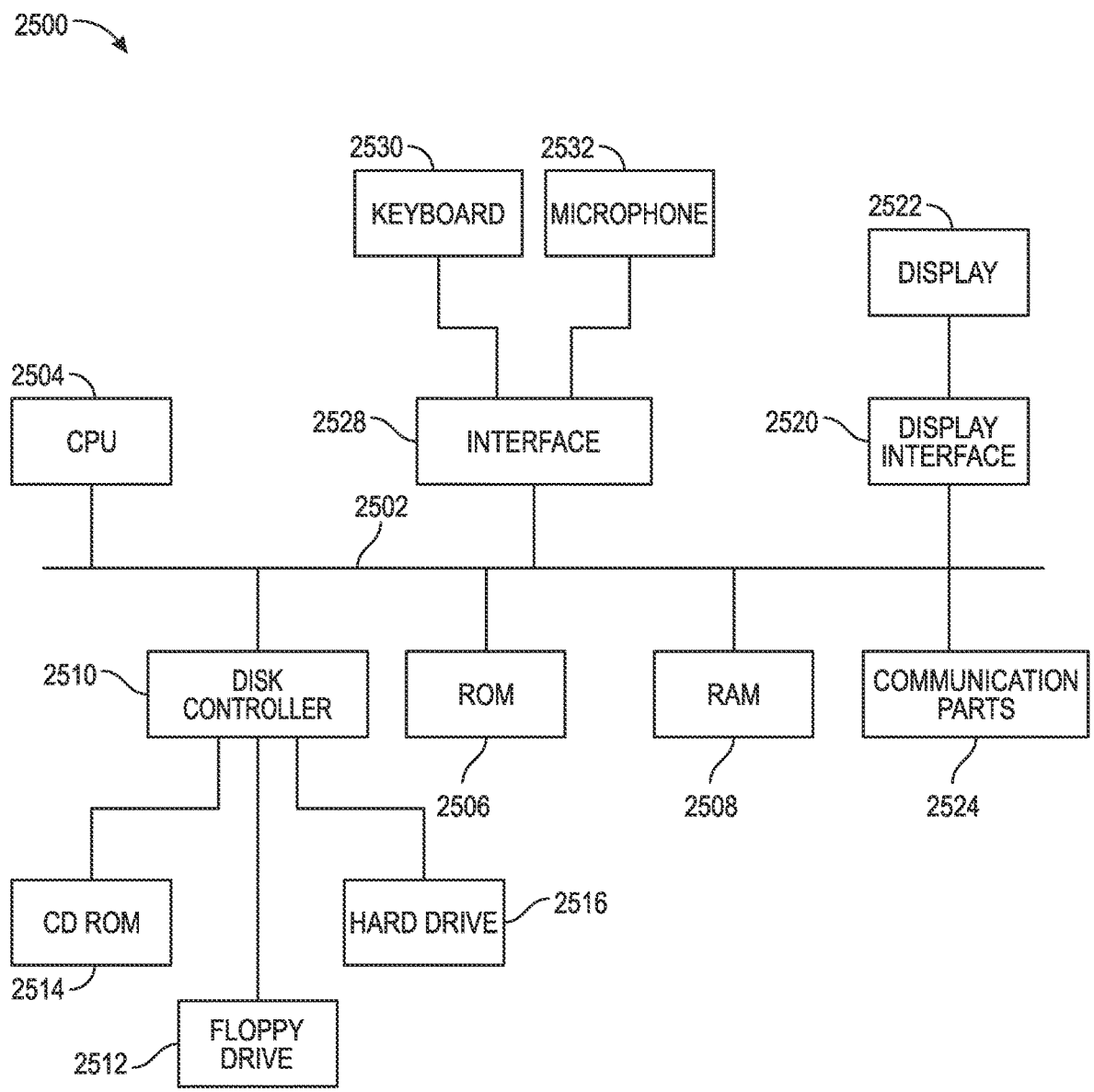

Referring to FIGS. 25, a system that may be used in conjunction with the embodiments described herein is shown. FIG. 25 shows a block diagram of exemplary hardware for a standalone computer architecture 2500, such as the architecture depicted in FIG. 24, that may be used to contain and/or implement the program instructions of system embodiments of the present invention. A bus 2502 may serve as the information highway interconnecting the other illustrated components of the hardware. A processing system 2504 labeled CPU (central processing unit) (e.g., one or more computer processors), may perform calculations and logic operations required to execute a program. A non-transitory computer-readable storage medium, such as read only memory (ROM) 2506 and random access memory (RAM) 2508, may be in communication with the processing system 2504 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

A disk controller 2510 interfaces one or more optional disk drives to the system bus 2502. These disk drives may be external or internal floppy disk drives such as 2512, external or internal CD-ROM, CD-R, CD-RW or DVD drives such as 2514, or external or internal hard drives 2516. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 2510, the ROM 2514 and/or the RAM 2516. Preferably, the processor 2504 may access each component as required.

A display interface 2520 may permit information from the bus 2502 to be displayed on a display 2522 in audio, graphic, or alphanumeric format. Communication with external devices may optionally occur using various communication ports 2524.

In addition to the standard computer-type components, the hardware may also include data input devices. The data input devices can transfer information to the bus 2502 through an interface 2528. The data input device can include a keyboard 2530, or other input device, such as a microphone 2532, remote control, pointer, mouse, touchscreen and/or joystick.

This written description describes exemplary embodiments of the invention, but other variations fall within scope of the disclosure. For example, the systems and methods may include and utilize data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

The methods and systems described herein may be implemented on many different types of processing devices by program code comprising program instructions that are executable by the device processing system. The software program instructions may include source code, object code, machine code, or any other stored data that is operable to cause a processing system to perform the methods and operations described herein. Any suitable computer languages may be used such as C, C++, Java, etc., as will be appreciated by those skilled in the art. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other non-transitory computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory computer-readable medium storing instructions executable by one or more processors of a system to cause the system to perform a method, comprising:

receiving a quadrilateral mesh representing a surface of a physical object, wherein the quadrilateral mesh includes an irregular element having an irregular node on a first edge representing a feature edge of the physical object and an interior irregular node in an interior of the quadrilateral mesh inward from the feature edge of the physical object, wherein the irregular node has a valence greater than 2 and the interior irregular node has a valence other than 4, wherein the first edge extends from the irregular node to an adjacent regular node, and wherein a set of control points includes the irregular node and the adjacent regular node;

identifying an edge point on the first edge as an additional control point, wherein the additional control point was added on the first edge between the irregular node and the adjacent regular node;

determining a knot interval vector and a basis function for the additional control point; and generating a spline surface representing the surface of the physical object based on the set of control points, the additional control point, the knot interval vector, and the basis function, wherein the spline surface preserves the feature edge of the physical object, and wherein the spline surface has C1 continuity across the irregular node along the feature edge of the physical object and across a 2-ring neighborhood around the interior irregular node inward from the feature edge of the physical object.

2. The non-transitory computer-readable medium of claim 1, wherein the edge point is one of a plurality of edge points on the first edge.

3. The non-transitory computer-readable medium of claim 1, wherein the quadrilateral mesh includes a second irregular element having the irregular node on a second edge representing the feature edge of the physical object, and further comprising:

identifying a second additional control point on the second edge;

determining a second knot interval vector and a second basis function for the second additional control point; and generating the spline surface representing the surface of the physical object based on the second additional control point, the second knot interval vector, and the second basis function.

4. The non-transitory computer-readable medium of claim 1, wherein the quadrilateral mesh includes a second edge extending from the first edge representing the feature edge to a second irregular node, and further comprising identifying a second edge point on the second edge as a second additional control point.

5. The non-transitory computer-readable medium of claim 1, wherein the knot interval vector of the additional control point includes a knot interval of zero in response to the first edge representing the feature edge.

6. The non-transitory computer-readable medium of claim 1, wherein, when the irregular node is on the first edge at a location not representing a corner of the feature edge, the edge point has a Bezier coefficient of 0.5.

7. The non-transitory computer-readable medium of claim 1, wherein, when the irregular node is on the first edge at a location representing a corner of the feature edge, the irregular node has a Bezier coefficient of 1.0.

8. The non-transitory computer-readable medium of claim 1 further comprising displaying the spline surface.

9. The non-transitory computer-readable medium of claim 1 further comprising performing, using the spline surface, a simulation to evaluate the physical object.

10. A computer-implemented method, comprising:

receiving, by a memory of a system, a quadrilateral mesh representing a surface of a physical object, wherein the quadrilateral mesh includes an irregular element having an irregular node on a first edge representing a feature edge of the physical object and an interior irregular node in an interior of the quadrilateral mesh inward from the feature edge of the physical object, wherein the irregular node has a valence greater than 2 and the interior irregular node has a valence other than 4, wherein the first edge extends from the irregular node to an adjacent regular node, and wherein a set of control points includes the irregular node and the adjacent regular node;

identifying, by one or more processors of the system, an edge point on the first edge as an additional control point;

determining, by the one or more processors, a knot interval vector and a basis function for the additional control point; and generating, by the one or more processors, a spline surface representing the surface of the physical object based on the set of control points, the additional control point, the knot interval vector, and the basis function, wherein the spline surface preserves the feature edge of the physical object, and wherein the spline surface has C1 continuity across the irregular node along the feature edge of the physical object and across a 2-ring neighborhood around the interior irregular node inward from the feature edge of the physical object.

11. The computer-implemented method of claim 10, wherein the first edge intersects a second edge at the irregular node, wherein the additional control point is on the first edge, and wherein a second additional control point is on the second edge.

12. The computer-implemented method of claim 10, wherein the quadrilateral mesh includes a second edge extending from the first edge representing the feature edge to a second irregular node, and wherein a second additional control point is on the second edge.

13. The computer-implemented method of claim 10, wherein the knot interval vector of the additional control point includes a knot interval of zero in response to the first edge representing the feature edge.

14. A system, comprising:

a memory to receive a quadrilateral mesh representing a surface of a physical object, wherein the quadrilateral mesh includes an irregular element having an irregular node on a first edge representing a feature edge of the physical object and an interior irregular node in an interior of the quadrilateral mesh inward from the feature edge of the physical object, wherein the irregular node has a valence greater than 2 and the interior irregular node has a valence other than 4, wherein the first edge extends from the irregular node to an adjacent regular node, and wherein a set of control points includes the irregular node and the adjacent regular node; and one or more processors to identify an edge point on the first edge as an additional control point, wherein the additional control point was added on the first edge between the irregular node and the adjacent regular node, determine a knot interval vector and a basis function for the additional control point, and generate a spline surface representing the surface of the physical object based on the set of control points, the additional control point, the knot interval vector, and the basis function, wherein the spline surface preserves the feature edge of the physical object, and wherein the spline surface has C1 continuity across the irregular node along the feature edge of the physical object and across a 2-ring neighborhood around the interior irregular node inward from the feature edge of the physical object.

15. The system of claim 14, wherein the first edge intersects a second edge at the irregular node, and wherein the one or more processors are further to identify a second additional control point on the second edge.

16. The system of claim 14, wherein the quadrilateral mesh includes a second edge extending from the first edge representing the feature edge to a second irregular node, and wherein a second additional control point is on the second edge.

17. The system of claim 14, wherein the knot interval vector of the additional control point includes a knot interval of zero in response to the first edge representing the feature edge.

* * * * *